(12) United States Patent
Templeton et al.

(10) Patent No.: US 6,492,075 B1
(45) Date of Patent: *Dec. 10, 2002

(54) CHEMICAL TRIM PROCESS

(75) Inventors: Michael K. Templeton, Atherton, CA (US); Ramkumar Subramanian, San Jose, CA (US); Bharath Rangarajan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 12 days.

This patent is subject to a terminal disclaimer.

(21) Appl. No.: 09/881,993

(22) Filed: Jun. 15, 2001

Related U.S. Application Data

(60) Provisional application No. 60/212,481, filed on Jun. 16, 2000.

(51) Int. Cl.$^7$ .......................... G03H 9/00; H01L 21/302
(52) U.S. Cl. ............................ 430/5; 438/725; 216/41; 216/48; 216/49
(58) Field of Search ............................ 430/5; 438/725; 216/49, 41, 48

(56) References Cited

U.S. PATENT DOCUMENTS

| 5,342,727 A | 8/1994 | Vicari et al. ................. 430/157 |
| 5,538,833 A | 7/1996 | Ferguson et al. ............ 430/325 |
| 5,807,649 A | 9/1998 | Liebmann et al. .............. 430/5 |
| 5,858,620 A | 1/1999 | Ishibashi et al. ............. 430/313 |
| 6,107,172 A | * 8/2000 | Yang et al. ................... 438/585 |
| 6,274,289 B1 | * 5/2001 | Subramanian et al. ... 430/273.1 |
| 6,383,952 B1 | * 8/2002 | Subramanian et al. ...... 438/781 |

OTHER PUBLICATIONS

"0.1um Level Contact Hole Pattern Formation with KrF Lithography by Resolution Enhancement Lithography Assisted by Chemical Shrink (RELACS)," T. Toyoshima, et al., Advanced Technology R&D Center, Mitsubishi Electric Corp., IEDM IEEE 1998, pp. 98–333–336.

"Monitoring Acid Diffusion in Chemically Amplified Photoresists," S. Postnikov, et al., Department of Chemistry and Biochemistry, University of Texas at Austin, Feb. 8, 1998.

* cited by examiner

Primary Examiner—George Goudreau
(74) Attorney, Agent, or Firm—Amin & Turocy, LLP

(57) ABSTRACT

In one embodiment, the present invention relates to a method of treating a patterned resist involving the steps of providing the patterned resist having structural features of a first size, the patterned resist containing a polymer having a labile group; contacting a coating containing at least one cleaving compound with the patterned resist to form a thin deprotected resist layer at an interface between the patterned resist and the coating; and removing the coating and the thin deprotected resist layer leaving the patterned resist having structural features of a second size, wherein the second size is smaller than the first size.

22 Claims, 2 Drawing Sheets

CHEMICAL TRIM PROCESS

This application claims the benefit of Provisional Application No. 60/212,481, filed Jun. 16, 2000.

TECHNICAL FIELD

The present invention generally relates to improving lithography by using a coating containing a cleaving compound to trim resist features. In particular, the present invention relates to using a coating containing a cleaving compound to controllably decrease the size of developed resist structures.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing density, smaller and smaller features sizes are required. This includes the width and spacing of interconnecting lines and the surface geometry such as corners and edges of various features. Since numerous interconnecting lines are typically present on a semiconductor wafer, the trend toward higher device densities is a notable concern.

The requirement of small features (and close spacing between adjacent features) requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, X-rays, or an electron beam) illuminates selected areas of the surface through an intervening master template, the photomask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photomask causes a chemical transformation in the exposed areas of the coating thereby making the image area either more or less soluble (depending on the coating) in a particular solvent developer. The more soluble areas are removed in the developing process to leave the pattern image in the coating as less soluble polymer.

Projection lithography is a powerful and essential tool for microelectronics processing. However, lithography is not without limitations. Patterning features having dimensions of about 0.25 $\mu$m or less with acceptable resolution is difficult at best, and impossible in some circumstances. Patterning small features with a high degree of critical dimension control is also very difficult. Procedures that increase resolution, improved critical dimension control, and provide small features are therefore desired.

SUMMARY OF THE INVENTION

The present invention provides chemical trim processes, methods of forming sub-lithographic features, and methods of treating patterned resists. The present invention also provides size reduced resist features that are particularly useful for subsequent semiconductor processing procedures. The methods of forming sub-lithographic features and treating patterned resists are conducted in a controllable manner whereby a specified size of the size reduced resist features may be achieved.

In one embodiment, the present invention relates to a method of treating a patterned resist involving the steps of providing the patterned resist having structural features of a first size, the patterned resist containing a polymer having a labile group; contacting a coating containing at least one cleaving compound with the patterned resist to form a thin deprotected resist layer at an interface between the patterned resist and the coating; and removing the coating and the thin deprotected resist layer leaving the patterned resist having structural features of a second size, wherein the second size is smaller than the first size.

In another embodiment, the present invention relates to a chemical trim process involving the steps of forming a patterned resist, the patterned resist containing a polymer having an acid labile pendent group; depositing an acid containing coating over the patterned resist, the acid containing coating comprising at least one acid and a coating material, thereby forming a thin deprotected resist layer at an interface between the patterned resist and the acid containing coating; and removing the acid containing coating and the thin deprotected resist layer thereby providing a trimmed patterned resist.

In yet another embodiment, the present invention relates to a method of making a sub-lithographic structure involving patterning a chemically amplified resist so as to have lithographic structures; contacting an acid containing coating with the patterned chemically amplified resist thereby forming a thin deprotected resist layer within the patterned chemically amplified resist; and removing the acid containing coating and the thin deprotected resist layer leaving sub-lithographic structures of the chemically amplified resist.

In yet another embodiment, the present invention relates to a chemical trim process involving the steps of forming a patterned resist, the patterned resist comprising a polymer having a base labile pendent group; depositing a base containing coating over the patterned resist, the base containing coating comprising at least one base and a coating material, thereby forming a thin deprotected resist layer at an interface between the patterned resist and the acid containing coating; and removing the base containing coating and the thin deprotected resist layer thereby providing a trimmed patterned resist.

In still another embodiment, the present invention relates to a chemical trim process involving the steps of forming a patterned resist, the patterned resist containing a polymer having an organic labile pendent group; depositing an organic compound containing coating over the patterned resist, the organic compound containing coating comprising at least one organic compound and a coating material, thereby forming a thin deprotected resist layer at an interface between the patterned resist and the acid containing coating; and removing the organic compound containing coating and the thin deprotected resist layer thereby providing a trimmed patterned resist.

DISCLOSURE OF INVENTION

Figure 1:
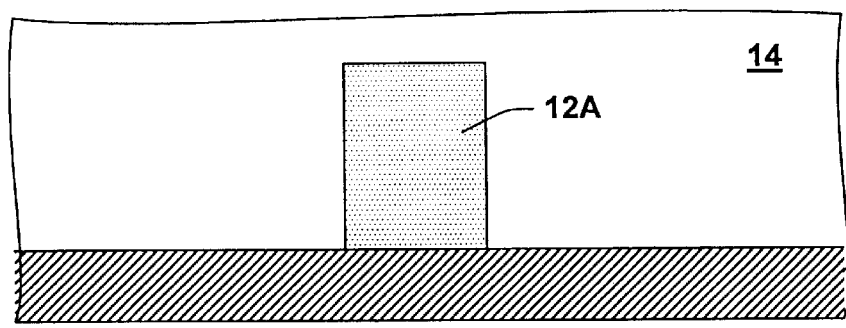
FIG. 1 illustrates a cross-sectional view of one aspect of a method according to the present invention.

The present invention involves using a coating containing a cleaving compound to controllably decrease the size of developed resist structures. The present invention thus involves resist trimming methods and/or methods of decreasing the size of a patterned resist below the limitations associated with lithography.

Basically, a coating containing a cleaving compound is deposited over a patterned resist. While the resist is in contact with the coating containing a cleaving compound, a chemical interaction takes place within the portions of the resist adjacent the coating forming a thin deprotected resist layer within the resist. Although not wishing to be bound by any theory, it is believed that the cleaving compound from the coating diffuses into a thin portion of the resist adjacent the coating. It is believed that cleaving compounds at or near the interface of the coating and the resist cause a chemical change wherein labile groups of the resist polymer are cleaved or deprotected and the cleaved or deprotected portions of the resist become removable by an appropriate solvent or developer. That is, the cleaving compound cleaves labile moieties of the resist material, thereby changing the solubility characteristics of the thin portion of the resist material wherein such cleavage takes place. Thus, a thin deprotected resist layer is formed within the developed resist which is then removable or further developable after or while the coating is removed.

For example, an acid containing coating is deposited over a patterned acid catalyzed resist. While the resist is in contact with the acid containing coating, a chemical interaction takes place within the portions of the resist adjacent the acid containing coating forming a thin deprotected resist layer within the resist. Again, although not wishing to be bound by any theory, it is believed that hydronium ions or protons from the acid containing coating diffuse into a thin portion of the resist adjacent the acid containing coating. It is believed that hydronium ions or protons at or near the interface of the acid containing coating and the resist polymer cause a chemical change wherein the deprotected portions of the resist become removable by an appropriate developer. That is, hydronium ions or protons cleave acid labile moieties of the resist material, such as t-butoxycarbonyl moieties from a resist polymer backbone, thereby changing the solubility characteristics of that portion of the resist material. Thus, a thin deprotected resist layer is formed within the developed resist which is then removable after or while the acid containing coating is removed.

Initially, a resist is deposited over a substrate. The substrate is typically a silicon substrate optionally with various elements and/or layers thereover including metal layers, barrier layers, dielectric layers, device structures, active elements and passive elements including polysilicon gates, wordlines, source regions, drain regions, bit lines, bases, emitters, collectors, conductive lines, conductive plugs, etc.

The resist is provided over a portion of the substrate or over all of the substrate. The resist is then patterned using suitable lithography techniques. For example, a mask is employed to selectively irradiate the resist, followed by development wherein the exposed or unexposed portions of the resist are removed. Any developer may be used to remove the exposed or unexposed portions of the resist including aqueous alkaline developers. Aqueous alkaline developers typically contain a hydroxide compound, such as tetramethylammonium hydroxide.

Any suitable resist polymer having a labile group may be employed in the present invention. The polymers are generally obtained by one or more of vinylic addition polymerization, condensation, polyaddition, and addition condensation. Suitable resist polymer have a cleavable labile group, such as an acid labile group (cleavable by an acid), a base labile group (cleavable by a base), and an organic labile group (cleavable by an organic compound). Typically, the resist polymer has a pendant labile group attached to the polymer backbone. Alternatively, the resist polymer has a labile group attached to one or more terminuses of the polymer backbone.

Generally, in one embodiment, the polymer is a polymer or copolymer of vinyl phenol and optionally other copolymerizable group(s). Copolymers comprise units of substituted or unsubstituted phenols and non-aromatic groups, particularly copolymers of vinyl phenols and alkyl acrylates, typically alkyl acrylates having from 1 to about 12 carbon atoms. Preferred are copolymers of vinyl phenols and acrylates having branched alkyl chains, such as copolymers formed from t-butyl acrylate, t-butyl methacrylate, etc.

In one embodiment, the polymer is at least one of poly (p-tert-butoxycarbonyloxy-α-methylstyrene), poly(p-tert-butoxycarbonyloxystyrene), poly(tert-butyl p-vinylbenzoate), poly(tert-butyl p-isopropenylphenyloxyacetate), poly(tert-butyl methacrylate), polymethylmethacrylate, acrylate based polymers, a novolak/diazonaphthoquinione resin, a nitrene crossed hydroxystyrene polymer, and poly(butene-1-sulfone). In another embodiment, the polymer comprises phenolic and cyclic alcohol units. In this embodiment, the polymer is formed by the hydrogenation of a phenol formaldehyde (novolak) or a poly(vinylphenol) resin. In yet another embodiment, the polymer comprises hydroxystyrene and acrylate, methacrylate, mixtures of acrylate and methacrylate, adamantyl methacrylate, 3-oxo-cyclohexyl methacrylate, tetrahydropyrannymethacrylate, trycyclodecanyl acrylate, isobornyl polymers, polynorbornene, polyanthrylmethacrylate, poly(vinylmethyl ether-co-maliec anhydride), poly(styrene-co-maliec anhydride).

In another embodiment, the polymeric material includes a partially t-butoxycarbonyloxy substituted poly-p-hydroxystyrene, partially t-butoxycarbonyloxy substituted poly-3-hydroxyphenyl phenylsiloxane, partially t-butyl substituted polymethacrylate, and partially adamantyl substituted polymethacrylate.

In one embodiment, the resist contains an acid catalyzed resin material. The acid catalyzed resin material undergoes a chemical change upon exposure to actinic radiation. Acid catalyzed or chemically amplified resist compositions generally comprise a photosensitive acid (photoacid) generator and a polymer. The polymer has acid sensitive side chain (pendent) groups which are bonded to the polymer backbone and are reactive towards a proton. Upon imagewise exposure to radiation or heat, the photoacid generator produces a proton. The proton causes catalytic cleavage of an acid labile pendant group from the polymer backbone. The proton is not consumed in the cleavage reaction and catalyzes additional cleavage reactions thereby chemically amplifying the photochemical response of the resist. The cleaved polymer is soluble in polar developers while the unexposed polymer is soluble in nonpolar organic solvents. Thus the resist can provide positive or negative images of the mask depending of the selection of the developer solvent.

In one embodiment, the base labile groups attached to the resist polymer include ethyl formate/butanethiol, acetate, trifluoracetate, benzoyl, anisoyl, dimethylpropanoyl, and 2-(p-tritylphenylthio)ethyl. More specific embodiments of acetate groups are listed in the paragraph below and are applicable here.

In another embodiment, the organic labile groups attached to the resist polymer include any organic group that can be cleaved by nucleophilic or electrophilic cleavage or substitution by an organic compound. Organic labile groups typically contain carbon atoms, and at least one of hydrogen atoms, oxygen atoms, nitrogen atoms, and sulfur atoms. Specific examples of organic labile groups are those organic groups listed as base labile groups and acid labile pendant groups, and thus they are applicable here but not repeated here.

Generally, in many embodiments, the acid labile pendent groups attached to the resist polymer are tert-butyl esters of carboxylic acids and tert-butyl carbonates of phenols, including trityl, benzyl, benzyhdryl modifications thereof. In one embodiment, the acid labile groups include acetate groups such as acetate groups of Formula (I) $CR^1R^2C(=O)OR^3$, where $R^1$ and $R^2$ are each independently one of hydrogen, an electron withdrawing group such as halogen, lower alkyl having from 1 to about 10 carbon atoms, and substituted lower alkyl having from 1 to about 10 carbon atoms; and $R^3$ is substituted and unsubstituted lower alkyl having from 1 to about 10 carbon atoms, substituted and unsubstituted aryl having from 1 to about 10 carbon atoms, substituted or unsubstituted benzyl having from about 7 to about 13 carbon atoms. The substituents can be, for example, one or more halogen, lower alkyl, lower alkoxy, aryl or benzyl. $R^1$ and $R^2$ in one embodiment are each hydrogen. In a preferred embodiment, $R^1$ and $R^2$ are both fluorine. In another embodiment, the acid labile groups include oxycarbonyl groups of the formula $C(=O)OR^3$, where $R^3$ is the same as defined above. In a preferred embodiment, $R^3$ is tert-butyl or benzyl.

In another embodiment, examples of the acid labile group include tertiary alkoxy groups such as tert-butoxy; tert-butyl methacrylate, carbonate groups such as tert-butoxycarbonyloxy; tertiary carboxylate groups such as tert-butoxycarbonylmethyloxy; trialkylsilyloxy groups such as trimethylsilyloxy, triethylsilyloxy, and tert-butyl-dimethylsilyloxy; and acetal and ketal groups such as tetrahydrofuranyloxy, tetrahydropyranyloxy, 2-methoxytetra-hydropyranyloxy, methoxymethyloxy, 1-ethoxyethoxy, 1-propoxyethoxy, 1-n-butoxyethoxy, 1-iso-butoxyethoxy, 1-sec-butoxyethoxy, 1-tert-butoxyethoxy, 1-amyloxyethoxy, 1-ethoxy-1-methylethoxy, 1-propoxy-1-methylethoxy, 1-n-butoxy-1-methylethoxy, 1-isobutoxy-1-methylethoxy, 1-sec-butoxy- 1-methylethoxy, 1-tert-butoxy-1-methylethoxy, and 1-amyloxy- 1-methylethoxy groups. Preferred examples of the aromatic group having an acid labile group are tert-butoxyphenyl, tert-butoxycarbonylmethyloxyphenyl, (1-ethoxyethoxy)phenyl, tetrahydropyranyloxyphenyl, and tetrahydrofuranyloxyphenyl groups.

The photoacid generator may be chosen from a wide variety of compounds known to form acid upon exposure to activating radiation. These photoacid generators form an acid in response to radiation of different wavelengths ranging from visible to X-ray. In one general embodiment, photoacid generating compounds include aromatic substituted halohydrocarbons (such as 1,1-bis(p-chlorophenyl)-2,2,2-trichloroethane), halo-substituted sulfur containing compounds, haloheterocyclic compounds, onium salts (such as diaryl diazonium salts), sulfonated esters, and sulfonated ketones.

In one embodiment, the photoacid generator is one or more unsubstituted and symmetrically or unsymmetrically substituted diaryliodonium, aryldiazonium, triarylselenonium or triarylsulfonium salts. In another embodiment, the photoinitiator is one or more nitrobenzyl esters and s-triazine derivatives.

In one embodiment, the photoacid generator is an o-quinone diazide sulfonic acid ester including 2,1,4-diazonaphthoquinone sulfonic acid esters and the 2,1,5-diazonaphthoquinone sulfonic acid esters. In another embodiment, the photoacid generator is a sulfonated ester including sulfonyloxy ketones. Examples include benzoin tosylate, t-butylphenyl alpha-(p-toluenesulfonyloxy)-acetate, and t-butyl alpha-(p-toluenesulfonyloxy)-acetate.

In yet another embodiment, the photoacid generator is an onium salt. Examples of suitable onium salts are diaryldiazonium salts and onium salts of Group Va and B, Ia and B and I of the Periodic Table, for example, halonium salts, quaternary ammonium, phosphonium and arsonium salts, aromatic sulfonium salts and sulfoxonium salts or seleonium salts.

In still yet another embodiment, the photoacid generator includes triaryl sulfonium hexafluoroantimonate, diaryliodonium metal halides, and certain non-ionic acid generators such as tris(sulfonate) of pyrogallol, and N-sulfonyloxynaphthalimides. In this embodiment, preferred examples include triphenylsulfonium triflate and N-sulfonyloxynaphthalimide generators such as N-camphorsulfonyloxynaphthalimide and N-pentafluorobenzenesulfonyloxnaphthalimide.

In yet another embodiment, the photoacid generator includes halogenated non-ionic, photoacid generating compounds such as, for example, 1,1-bis [p-chlorophenyl]-2,2,2-trichloroethane (DDT); 1,1-bis [p-methoxyphenyl]-2,2,2-trichloroethane; 1,2,5,6,9,10-hexabromocyclododecane; 1,10-dibromodecane; 1,1-bis[p-chloropehnyl]-2,2-dichloroethane; 4,4'-dichloro-2-(trichloromethyl) benzhydrol (Kelthane); hexachlorodimethyl sulfone; 2-chloro-6-(trichloromethyl) pyridine; 0,0-diethyl-0-(3,5,6-trichloro-2-pyridyl)phosphorothionate; 1,2,3,4,5,6-hexachlorocyclohexane; N(1,1-bis [p-chlorophenyl]-2,2,2-trichloroethyl)acetamide; tris [2,3-dibromopropyl] isocyanurate; 2,2-bis [p-chlorophenyl]-1,1-dichloroethylene; tris [trichloromethyl] s-triazine; and their isomers, analogs, homologs, and residual compounds.

In yet another embodiment, the photoacid generator includes sulfonium salts. Examples of sulfonium salts include tris(4-dimethylaminophenyl)sulfonium p-toluenesulfonate; bis(4-tert-butoxyphenyl)(4-dimethylaminophenyl)sulfonium p-toluenesulfonate; (4-tert-butoxyphenyl)bis(4-dimethylaminophenyl) sulfonium p-toluenesulfonate; bis(4-tert-butoxycarbonylmethyloxyphenyl)(4-dimethylaminophenyl)sulfonium p-toluenesulfonate; (4-tert-butoxycarbonylmethyloxyphenyl)bis(4-dimethylaminophenyl)sulfonium p-toluenesulfonate; bis(4-(1-ethoxyethyloxy)phenyl)(4-dimethylaminophenyl)-sulfonium p-toluenesulfonate; (4-(1-ethoxyethyloxy) phenyl)bis(4-dimethylaminophenyl)-sulfonium p-toluenesulfonate; bis(4-tetrahydropyranyloxyphenyl)(4-dimethylaminophenyl)-sulfonium p-toluenesulfonate; (4-tetrahydrofuranyloxyphenyl)bis(4-dimethylaminophenyl)-sulfonium p-toluenesulfonate; tris (4-dimethylaminophenyl)sulfonium p-ethylbenzenesulfonate; bis(4-tert-butoxyphenyl)(4-dimethylaminophenyl)sulfonium p-ethylbenzenesulfonate;

(4-tert-butoxyphenyl)bis(4-dimethylaminophenyl) sulfonium p-ethylbenzenesulfonate; tris(4-dimethylaminophenyl)sulfonium 2,4-dimethylbenzenesulfonate; bis(4-tert-butoxyphenyl)(4-dimethylaminophenyl)sulfonium 2,4-dimethylbenzenesulfonate; (4-tert-butoxyphenyl)bis(4-dimethylaminophenyl)sulfonium 2,4-dimethylbenzenesulfonate; (4-tert-butoxyphenyl)bis(4-dimethylaminophenyl)sulfonium p-tert-butylbenzenesulfonate; bis(4-tert-butoxycarbonylmethyloxyphenyl)(4-dimethylaminophenyl)sulfonium 2,5-dimethylbenzenesulfonate; (4-tert-butoxycarbonylmethyloxyphenyl)bis(4-dimethylaminophenyl)sulfonium n-octylbenzenesulfonate; tris(4-dimethylaminophenyl)sulfonium p-tert-butylbenzenesulfonate; bis(4-tert-butoxyphenyl)(4-dimethylaminophenyl)sulfonium p-tert-butylbenzenesulfonate; (4-tert-butoxyphenyl)bis(4-dimethylaminophenyl)sulfonium benzenesulfonate; bis(4-tert-butoxycarbonylmethyloxyphenyl)(4-dimethylaminophenyl)sulfonium, benzenesulfonate; (4-tert-butoxycarbonylmethyloxyphenyl)bis(4-dimethylaminophenyl)sulfonium benzenesulfonate; tris(3-dimethylaminophenyl)sulfonium p-toluenesulfonate; bis(4-tert-butoxyphenyl)(3-dimethylaminophenyl)sulfonium p-toluenesulfonate; (4-tert-butoxyphenyl)bis(3-dimethylaminophenyl)sulfonium p-toluenesulfonate; bis(4-tert-butoxycarbonylmethyloxyphenyl)(3-dimethylaminophenyl)sulfonium p-toluenesulfonate; (4-tert-butoxycarbonylmethyloxyphenyl)bis(3-dimethylaminophenyl)sulfonium p-toluenesulfonate; bis(4-(1-ethoxyethyloxy)phenyl)(3-dimethylaminophenyl)-sulfonium p-toluenesulfonate; (4-(1-ethoxyethyloxy)phenyl)bis(3-dimethylaminophenyl)-sulfonium p-toluenesulfonate; bis(4-tetrahydropyranyloxyphenyl)(3-dimethylaminophenyl)-sulfonium p-toluenesulfonate; (4-tetrahydrofuranyloxyphenyl)bis(3-dimethylaminophenyl)sulfonium p-toluenesulfonate; tris(3-dimethylaminophenyl)sulfonium p-ethylbenzenesulfonate; bis(4-tert-butoxyphenyl)(3-dimethylaminophenyl) sulfonium 2,4-dimethylbenzenesulfonate; (4-tert-butoxyphenyl)bis(3-dimethylaminophenyl)sulfonium n-octylbenzenesulfonate; bis(4-tert-butoxyphenyl)(3-dimethylaminophenyl)sulfonium benzenesulfonate; (4-tert-butoxyphenyl)bis(3-dimethylaminophenyl)sulfonium p-tert-butylbenzenesulfonate; bis(4-tert-butoxycarbonylmethyloxyphenyl)(3-dimethylaminophenyl)sulfonium benzenesulfonate, (4-tert-butoxycarbonylmethyloxyphenyl)bis(3-dimethylaminophenyl)sulfonium benzenesulfonate; tris(4-(2-picolyloxy)phenyl)sulfonium p-toluenesulfonate; bis(4-tert-butoxyphenyl)(4-(2-picolyloxy)phenyl)sulfonium p-toluenesulfonate; (4-tert-butoxyphenyl)bis(4-(2-picolyloxy)phenyl)sulfonium p-toluenesulfonate; bis(4-tert-butoxycarbonylmethyloxyphenyl)(4-(2-picolyloxy)phenyl) sulfonium p-toluenesulfonate; (4-tert-butoxycarbonylmethyloxyphenyl)bis(4-(2-picolyloxy) phenyl)sulfonium p-toluenesulfonate; bis(4-(1-ethoxyethyloxy)phenyl)(4-(2-picolyloxy)phenyl)-sulfonium p-toluenesulfonate; (4-(1-ethoxyethyloxy)phenyl)bis(4-(2-picolyloxy)phenyl)-sulfonium p-toluenesulfonate; bis(4-tetrahydropyranyloxyphenyl)(4-(2-picolyloxy)phenyl)-sulfonium p-toluenesulfonate; (4-tetrahydrofuranyloxyphenyl)bis(4-(2-picolyloxy)phenyl)-sulfonium p-toluenesulfonate; tris(4-(2-picolyloxy)phenyl)sulfonium p-ethylbenzene-sulfonate; tris(4-(2-picolyloxy)phenyl)sulfonium 2,4-dimethylbenzenesulfonate; bis(4-tert-butoxyphenyl)(4-(2-picolyloxy)phenyl)sulfonium 2,4-dimethylbenzenesulfonate; (4-tert-butoxyphenyl)bis(4-(2-picolyloxy)phenyl)sulfonium 2,4-dimethylbenzenesulfonate; (4-tert-butoxyphenyl)bis(4-(2-picolyloxy)phenyl)sulfonium p-tert-butylbenzenesulfonate; bis(4-tert-butoxycarbonylmethyloxyphenyl)(4-(2-picolyloxy)phenyl)sulfonium 2,5-dimethylbenzenesulfonate; (4-tert-butoxycarbonylmethyloxyphenyl)bis(4-(2-picolyloxy)phenyl)sulfonium n-octylbenzenesulfonate; tris(4-(2-picolyloxy)phenyl)sulfonium p-tert-butylbenzenesulfonate; bis(4-tert-butoxyphenyl)(4-(2-picolyloxy)phenyl)sulfonium benzenesulfonate; (4-tert-butoxyphenyl)bis(4-(2-picolyloxy)phenyl)sulfonium benzenesulfonate; bis(4-tert-butoxycarbonylmethyloxyphenyl)(4-(2-picolyloxy)phenyl) sulfonium benzenesulfonate; (4-tert-butoxycarbonylmethyloxyphenyl)bis(4-(2-picolyloxy)phenyl)sulfonium benzenesulfonate; tris(4-(4-picolyloxy)phenyl)sulfonium p-toluenesulfonate; bis(4-tert-butoxyphenyl)(4-(4-picolyloxy)phenyl)sulfonium p-toluenesulfonate; (4-tert-butoxyphenyl)bis(4-(4-picolyloxy)phenyl)sulfonium p-toluenesulfonate; bis(4-tert-butoxycarbonylmethyloxyphenyl)(4-(4-picolyloxy)-phenyl) sulfonium p-toluenesulfonate; (4-tert-butoxycarbonylmethyloxyphenyl)bis(4-(4-picolyloxy)-phenyl)sulfonium p-toluenesulfonate; bis(4-(1-ethoxyethyloxy)phenyl)(4-(4-picolyloxy)phenyl)-sulfonium p-toluenesulfonate; (4-(1-ethoxyethyloxy)phenyl)bis(4-(4-picolyloxy)phenyl)-sulfonium p-toluenesulfonate; bis(4tetrahydropyranyloxyphenyl)(4-(4-picolyloxy)phenyl)-sulfonium p-toluenesulfonate; (4-tetrahydropyranyloxyphenyl)bis(4-(4-picolyloxy)phenyl)-sulfonium p-toluenesulfonate; tris(4-(4-picolyloxy)phenyl)sulfonium p-ethylbenzene-sulfonate; tris(4-(4-picolyloxy)phenyl)sulfonium 2,4-dimethylbenzenesulfonate; bis(4-tert-butoxyphenyl)(4-(4-picolyloxy)phenyl)sulfonium 2,4-dimethylbenzenesulfonate; (4-tert-butoxyphenyl)bis(4-(4-picolyloxy)phenyl)sulfonium 2,4-dimethylbenzenesulfonate; (4-tert-butoxycarbonylmethyloxyphenyl)bis(4-(4-picolyloxy)-phenyl)sulfonium 2,4-dimethylbenzenesulfonate; bis(4-tert-butoxyphenyl)(4-(4-picolyloxy)phenyl)sulfonium p-tert-butylbenzenesulfonate; (4-tert-butoxyphenyl)bis(4-(4-picolyloxy)phenyl)sulfonium p-tert-butylbenzenesulfonate; bis(4-tert-butoxycarbonylmethyloxyphenyl)(4-(4-picolyloxy)-phenyl)sulfonium 2,5-dimethylbenzenesulfonate; (4-tert-butoxycarbonylmethyloxyphenyl)bis(4-(4-picolyloxy)phenyl)sulfonium n-octylbenzenesulfonate; tris(4-(4-picolyloxy)phenyl)sulfonium p-tert-butylbenzenesulfonate; bis(4-tert-butoxyphenyl)(4-(4-picolyloxy)phenyl)sulfonium benzenesulfonate; (4-tert-butoxyphenyl)bis(4-(4-picolyloxy)phenyl)sulfonium p-tert-butylbenzenesulfonate; bis(4-tert-butoxycarbonylmethyloxyphenyl)(4-(4-picolyloxy)-phenyl)sulfonium benzenesulfonate; (4-tert-butoxycarbonylmethyloxyphenyl)bis(4-(4-picolyloxy)-phenyl)sulfonium benzenesulfonate; tris(3-(4-picolyloxy)phenyl)sulfonium p-toluenesulfonate; bis(4-tert-butoxyphenyl)(3-(4-picolyloxy)phenyl)sulfonium p-toluenesulfonate; (4-tert-butoxyphenyl)bis(3-(4-picolyloxy)phenyl)sulfonium p-toluenesulfonate; bis(4-tert-butoxycarbonylmethyloxyphenyl)(3-(4-picolyloxy)-phenyl) sulfonium p-toluenesulfonate; (4-tert-butoxycarbonylmethyloxyphenyl)bis(3-(4-picolyloxy)-phenyl)sulfonium p-toluenesulfonate; bis(4-(1-ethoxyethyloxy)phenyl)(3-(4-picolyloxy)phenyl)-sulfonium p-toluenesulfonate; (4-(1-ethoxyethyloxy)phenyl)bis(3-(4-picolyloxy)phenyl)-sulfonium p-toluenesulfonate; bis(4-tetrahydropyranyloxyphenyl)(3-(4-picolyloxy)phenyl)-sulfonium p-toluenesulfonate; (4-tetrahydrofuranyloxyphenyl)bis(3-(4-picolyloxy)phenyl)-sulfonium p-toluenesulfonate; tris(3-(4-picolyloxy)phenyl)sulfonium p-ethylbenzene-sulfonate; tris(3-(4-picolyloxy)phenyl)sulfonium 2,4-dimethylbenzene-sulfonate; bis(4-tert-butoxyphenyl)(3-(4-picolyloxy)phenyl)sulfonium 2,4-dimethylbenzenesulfonate; (4-tert-butoxyphenyl)bis(3-(4-picolyloxy)phenyl)sulfonium 2,4-dimethylbenzenesulfonate; bis(4-tert-butoxycarbonylmethyloxyphenyl)(3-(4-picolyloxy)-phenyl)sulfonium 2,4-dimethylbenzenesulfonate; (4-tert-butoxycarbonylmethyloxyphenyl)bis(3-(4-picolyloxy)-phenyl)sulfonium 2,4-dimethylbenzenesulfonate; (4-tert-butoxycarbonylmethyloxyphenyl)bis(3-(4-picolyloxy)-phenyl)sulfonium n-octylbenzenesulfonate; tris(3-(4-picolyloxy)phenyl)sulfonium benzenesulfonate; bis(4-tert-butoxyphenyl)(3-(4-picolyloxy)phenyl)sulfonium benzenesulfonate; (4-tert-butoxycarbonylmethyloxyphenyl)bis(3-(4-picolyloxy)phenyl)sulfonium benzenesulfonate; tris(3-(2-picolyloxy)phenyl)sulfonium p-toluenesulfonate; bis(4-tert-butoxyphenyl)(3-(2-picolyloxy)phenyl)sulfonium p-toluenesulfonate; (4-tert-butoxyphenyl)bis(3-(2-picolyloxy)phenyl)sulfonium p-toluenesulfonate; bis(4-tert-butoxycarbonylmethyloxyphenyl)(3-(2-picolyloxy)-phenyl)sulfonium p-toluenesulfonate; (4-tert-butoxycarbonylmethyloxyphenyl)bis(3-(2-picolyloxy)-phenyl)sulfonium p-toluenesulfonate; bis(4-(1-ethoxyethyloxy)phenyl)(3-(2-picolyloxy)phenyl)-sulfonium p-toluenesulfonate; (4-(1-ethoxyethyloxy)phenyl)bis(3-(2-picolyloxy)phenyl)-sulfonium p-toluenesulfonate; bis(4-tetrahydropyranyloxyphenyl)(3-(2-picolyloxy)phenyl)-sulfonium p-toluenesulfonate; (4-tetrahydrofuranyloxyphenyl)bis(3-(2-picolyloxy)phenyl)-sulfonium p-toluenesulfonate; tris(3-(2-picolyloxy)phenyl)sulfonium p-ethylbenzene-sulfonate; tris(3-(2-picolyloxy)phenyl)sulfonium 2,4-dimethylbenzene-sulfonate; bis(4-tert-butoxyphenyl)(3-(2-picolyloxy)phenyl)sulfonium 2,4-dimethylbenzenesulfonate; (4-tert-butoxyphenyl)bis(3-(2-picolyloxy)phenyl)sulfonium 2,4-dimethylbenzenesulfonate; (3-tert-butoxyphenyl)bis(3-(2-picolyloxy)phenyl)sulfonium p-tert-butylbenzenesulfonate; bis(4-tert-butoxycarbonylmethyloxyphenyl)(3-(2-picolyloxy)-phenyl)sulfonium 4-tert-butylbenzenesulfonate; (4-tert-butoxycarbonylmethyloxyphenyl)bis(3-(2-picolyloxy)-phenyl)sulfonium n-octylbenzenesulfonate; tris(3-(2-picolyloxy)phenyl)sulfonium benzenesulfonate; bis(4-tert-butoxyphenyl)(3-(2-picolyloxy)phenyl)sulfonium benzenesulfonate; (4-tert-butoxycarbonylmethyloxyphenyl)bis(3-(2-picolyloxy)-phenyl)sulfonium benzenesulfonate; tris(pyridin-3-yl)sulfonium p-toluenesulfonate; bis(4-tert-butoxyphenyl)(pyridin-3-yl)sulfonium p-toluenesulfonate; (4-tert-butoxyphenyl)bis(pyridin-3-yl)sulfonium p-toluenesulfonate; bis(4-tert-butoxycarbonylmethyloxyphenyl)(pyridin-3-yl)-sulfonium p-toluenesulfonate; (4-tert-butoxycarbonylmethyloxyphenyl)bis(pyridin-3-yl)-sulfonium p-toluenesulfonate; bis(4-(1-ethoxyethyloxy)phenyl)(pyridin-3-yl)sulfonium p-toluenesulfonate; (4-(1-ethoxyethyloxy)phenyl)bis(pyridin-3-yl)sulfonium p-toluenesulfonate; bis(4-tetrahydropyranyloxyphenyl)(pyridin-3-yl)sulfonium p-toluenesulfonate; (4-tetrahydrofuranyloxyphenyl)bis(pyridin-3-yl)sulfonium p-toluenesulfonate; tris(pyridin-3-yl)sulfonium p-ethylbenzenesulfonate; tris(pyridin-3-yl)sulfonium 2,4-dimethylbenzenesulfonate; bis(4-tert-butoxyphenyl)(pyridin-3-yl)sulfonium 2,4-dimethyl-benzenesulfonate; (4-tert-butoxycarbonylmethyloxyphenyl)bis(pyridin-3-yl)-sulfonium 2,4-dimethylbenzenesulfonate; (4-tert-butoxyphenyl)bis(pyridin-3-yl)sulfonium p-tert-butylbenzenesulfonate; (4-tert-butoxycarbonylmethyloxyphenyl)bis(pyridin-3-yl)-sulfonium n-octylbenzenesulfonate; tris(pyridin-3-yl)sulfonium benzenesulfonate; bis(4-tert-butoxyphenyl)(pyridin-3-yl)sulfonium benzenesulfonate; (4-tert-butoxycarbonylmethyloxyphenyl)bis(pyridin-3-yl)-sulfonium benzenesulfonate; tris(pyridin-2-yl)sulfonium p-toluenesulfonate; bis(4-tert-butoxyphenyl)(pyridin-2-yl)sulfonium p-toluenesulfonate; (4-tert-butoxyphenyl)bis(pyridin-2-yl)sulfonium p-toluenesulfonate; bis(4-tert-butoxycarbonylmethyloxyphenyl)(pyridin-2-yl)-sulfonium p-toluenesulfonate; (4-tert-butoxycarbonylmethyloxyphenyl)bis(pyridin-2-yl)-sulfonium p-toluenesulfonate; bis(4-(1-ethoxyethyloxy)phenyl)(pyridin-2-yl)sulfonium p-toluenesulfonate; (4-(1-ethoxyethyloxy)phenyl)bis(pyridin-2-yl)sulfonium p-toluenesulfonate; bis(4-tetrahydropyranyloxyphenyl)(pyridin-2-yl)sulfonium p-toluenesulfonate; (4-tetrahydrofuranyloxyphenyl)bis(pyridin-2-yl)sulfonium p-toluenesulfonate; tris(pyridin-2-yl)sulfonium p-ethylbenzenesulfonate; tris(pyridin-2-yl)sulfonium 2,4-dimethylbenzenesulfonate; bis(4-tert-butoxyphenyl)(pyridin-2-yl)sulfonium 2,4-dimethylbenzenesulfonate; (4-tert-butoxyphenyl)bis(pyridin-2-yl)sulfonium 2,4-dimethylbenzenesulfonate; bis(3-tert-butoxycarbonylmethyloxyphenyl)(pyridin-2-yl)-sulfonium 2,4-dimethylbenzenesulfonate; (4-tert-butoxycarbonylmethyloxyphenyl)bis(pyridin-2-yl)-sulfonium 2,4-dimethylbenzenesulfonate; (4-tert-butoxyphenyl)bis(pyridin-2-yl)sulfonium p-tert-butylbenzenesulfonate; (4-tert-butoxycarbonylmethyloxyphenyl)bis(pyridin-2-yl)-sulfonium n-octylbenzenesulfonate; and tris(pyridin-2-yl)sulfonium benzenesulfonate.

In still yet another embodiment, the photoacid generator includes alkylsulfonium salts. Examples of alkylsulfonium salts include cyclohexylmethyl(2-oxocyclohexyl) sulfonium trifluoromethanesulfonate; dicyclohexyl(2-oxocyclohexyl) sulfonium trifluoromethanesulfonate; cyclopentylmethyl(2-oxocyclohexyl)sulfonium trifluoromethanesulfonate; and cycloheptylmethyl(2-oxocyclopentyl)sulfonium trifluoromethanesulfonate.

Any suitable wavelength of radiation may be employed to expose the resist. For example, radiation having wavelengths from about 1 nm to about 500 nm may be employed, including X-rays and electron beams (e-beams). Resists may include a 157 nm sensitive resist, a 193 nm sensitive resist, an I-line, H-line, G-line, E-line, mid UV, deep UV, an extreme UV resist material, an X-ray sensitive resist, and an e-beam sensitive resist. Deep UV resists are preferred. Resists are commercially available from a number of sources, including Shipley Company, Kodak, Hoechst Celanese Corporation, Arch Chemical, Aquamer, Hunt, Clariant, JSR Microelectronics, and Brewer. A specific example of a deep UV photoresist is a combination of a partially t-butoxycarbonyloxy substituted poly-p-hydroxystyrene and a photoacid generator.

The resist may be deposited using any suitable means on the substrate. For example, the resist may be spin-coated on the substrate. The resist is applied to any suitable thickness as the thickness is not critical to the invention. In one embodiment, the resist is applied to a thickness from about 200 Å to about 30,000 Å. In another embodiment, the resist is applied to a thickness from about 1,000 Å to about 15,000 Å.

A coating containing a cleaving compound is deposited over the patterned resist. The coating contains at least one cleaving compound and a coating material. The coating material is typically a polymeric material suitable for forming removable coatings. A removable coating can be adsorbed, dissolved, and/or solubilized by a removing solution. Coating materials include water soluble polymers, base soluble polymers, acid soluble polymers, and organic soluble polymers. Thus, removing solutions include suitable aqueous solutions, base solutions, acid solutions, and organic solvents.

The cleaving compound is mobile within the coating in that it can migrate to the interface between the coating and the patterned resist and diffuse into the patterned resist. Cleaving compounds include acids, bases, and organic compounds. Such cleaving compounds respectively cleave acid labile groups, base labile groups, and organic labile groups that are attached to the resist polymer backbone.

In one embodiment, a base containing coating is deposited over the patterned resist. In this embodiment, the coating contains at least one base cleaving compound and a coating material. Bases generally include organic bases and inorganic bases. Bases more specifically include alkali metal, alkaline earth metal and ammonium hydroxides, silicates, phosphates, borates, carbonates, and mixtures thereof, and amines and mixtures thereof. For example, the base may include one or more alkali metal hydroxides, alkaline earth metal hydroxides, ammonium hydroxides, alkali metal silicate s and so on.

Alkali metals include lithium, sodium, potassium, rubidium and cesium. Alkaline earth metals include beryllium, magnesium, calcium, strontium, and barium. Ammonium ions include quaternary ammonium ions represented by Formula (II):

(II)

where $R^4$ to $R^7$ are individually selected from hydrogen and alkyl groups containing 1 to about 5 carbon atoms, and hydroxyalkyl containing 1 to about 5 carbon atoms. In a preferred embodiment, $R^4$ to $R^7$ are each hydrogen, methyl or ethyl.

Specific examples of bases include sodium tetraborate, sodium carbonate, sodium bicarbonate, sodium hydroxide, sodium phosphate, sodium pyrophosphate and other polyphosphates, sodium silicate, potassium carbonate, potassium bicarbonate, potassium hydroxide, potassium phosphate, potassium pyrophosphate and other polyphosphates, ammonium carbonate, ammonium hydroxide, ammonium hydrogen phosphate, ammonium phosphate, calcium carbonate, calcium hydroxide, calcium phosphate, calcium pyrophosphate, calcium silicate, magnesium carbonate, magnesium hydroxide, magnesium phosphate, magnesium pyrophosphate, magnesium silicate, tetramethylammonium carbonate, tetramethylammonium hydroxide, tetramethylammonium hydrogen phosphate, tetramethylammonium phosphate, tetraethylammonium carbonate, tetraethylammonium hydroxide, tetraethylammonium hydrogen phosphate, tetraethylammonium phosphate, or mixtures of two or more thereof.

Amines include aliphatic amines, cycloaliphatic amines, aromatic amines and heterocyclic amines. The amine may be a primary, secondary or tertiary amine. The amine may be a monoamine, diamine or polyamine. In another embodiment, the amine is a hydroxyamine. Examples of hydroxyamines include hydroxyamines having one or more hydroxyalkyl groups each having 1 to about 8 carbon atoms, and preferably 1 to about 5 carbon atoms such as hydroxymethyl, hydroxyethyl and hydroxybutyl groups. Specific examples of hydroxyamines include mono-, di- and tri-ethanolamine, 3-amino-1-propanol, 2-amino-2-methyl-1-propanol, 2-amino-2-ethyl-1,3-propanediol, tris(hydroxymethyl) aminomethane, N-methylethanolamine, 2-diethylamino-2-methyl-1-propanol and triethanolamine.

In another embodiment, an organic compound containing coating is deposited over the patterned resist. In this embodiment, the coating contains at least one organic cleaving compound and a coating material. Organic compounds include organic solvents, especially those at least partially soluble in water, such as organic compounds containing at least oxygen atom. Examples of organic compounds include ketones such as acetone, methyl ethyl ketone, methyl isobutyl ketone, mesityl oxide, methyl amyl ketone, cyclohexanone and other aliphatic ketones; esters such as methyl acetate, ethyl acetate, iso-amyl acetate, alkyl carboxylic esters; ethers such as methyl t-butyl ether, dibutyl ether, methyl phenyl ether, and other aliphatic or alkyl aromatic ethers; glycol ethers such as ethoxy ethanol, butoxy ethanol, ethoxy-2-propanol, propoxy ethanol, butoxy propanol and other glycol ethers; glycol ether esters such as butoxy ethoxy acetate, ethyl 3-ethoxy propionate and other glycol ether esters; alcohols such as methanol, ethanol, propanol, iso-propanol, butanol, iso-butanol, amyl alcohol and other aliphatic alcohols; and glycol ethers such as ethylene glycol methyl ether, ethylene glycol methylbutyl ether, ethylene glycol ethylbutyl ether, ethylene glycol ethyl ether, ethylene glycol butyl ether, ethylene glycol dimethyl ether, ethylene glycol diethyl ether, ethylene glycol dibutyl ether, and the like.

In yet another embodiment, an acid containing coating is deposited over the patterned resist. In this embodiment, the coating contains at least one acid cleaving compound and a coating material. Acids include inorganic acids, organic acids and photoacid generators. Specific examples of inorganic acids include nitric acid, halogen acids such as hydrofluoric acid, hydrochloric acid, hydrobromic acid and hydriotic acid, sulfuric acid, sulfurous acid, perchloric acid, boric acid and phosphorus acids such as phosphorus acid and phosphoric acid. Of these inorganic acids, sulfuric acid is preferred.

Organic acids include carboxylic acids and polycarboxylic acids such as alkanoic acids, including formic acid, acetic acid, propionic acid, butyric acid and so on, dichloroacetic acid, trichloroacetic acid, perfluoroacetic acid, perfluorooctanoic acid, (generally containing 1 to about 10 carbon atoms), dicarboxylic acids, such as oxalic acid, malonic acid, succinic acid and so on (generally containing 1 to about 12 carbon atoms), hydroxyalkanoic acids, such as citric acid (generally containing 1 to about 10 carbon atoms), organic phosphorus acids such as dimethylphosphoric acid and dimethylphosphinic acid, sulfonic acids such as alkylsulfonic acids (containing 1 to about 20 carbon atoms) including methanesulfonic acid, ethanesulfonic acid, 1-pentanesulfonic acid, 1-hexanesulfonic acid, 1-heptanesulfonic acid, aromatic sulfonic acids such as benzenesulfonic acid, benzenedisulfonic acid, tolulenesulfonic acid, naphthalenesulfonic acid, etc.

As stated above, photoacid generators produce acids due to light or heat activation. The photoacid generators mentioned above in connection with the resist materials may also be employed in the acid containing coating. They are not listed again here for the sake of brevity. Nevertheless, preferred photoacid generators for the acid containing coating include oniumtriflates such as triphenylsulfonium trifluoromethylsulfonate; triazine derivatives, carboximide sulfonates; methane sulfonoxybenzene; and nitrobenzyl esters such as 4-nitrobenzenesulfonic acid-2-6-dinitrobenzyl ester; 4-methoxybenzenesulfonic acid-2-6-dinitrobenzyl ester; toluenesulfonic acid-2-6dinitrobenzyl ester; trifluoracetic acid-2-6-dinitrobenzyl ester; 2,3,4,5,6-pentafluorobenzenesulfonic acid-2-6-dinitrobenzyl ester; phenylsulfonic acid-2-6-dinitrobenzyl ester; methylsulfonic acid-2-6-dinitrobenzyl ester; perfluorooctanoic acid-2-6-dinitrobenzyl ester; and trifluormethylsulfonic acid-2-6-dinitrobenzyl ester. Moreover, in some embodiments, two or more of any of the above-described acids may be used.

Water soluble polymers according to the invention are those which can form films. Water soluble polymers include poly(acrylic acid), poly(methacrylic acid), poly(vinyl alcohol), poly(vinyl acetal), mixtures of poly(vinyl acetal) and methoxy-methylol-urea, mixtures of poly(vinyl acetal) and methoxy-methylol-melamine, mixtures of poly(vinyl acetal), methoxy-methylol-melamine and polyallyl-amine, cellulose derivatives including hydroxypropyl cellulose, hydroxyethyl cellulose, hydroxyalkyl alkali metal carboxylalkyl cellulose derivatives, and free acid hydroxyalkyl carboxyalkyl cellulose derivatives, natural polysaccharide gums and their derivatives, polyethylene glycol, water soluble polyesters, polyvinyl pyrrolidone, polycarboxylic acid derivatives, vinyl methyl ether homopolymers and copolymers, casein, gelatin, solubilized proteins, polyacrylamide, polyamines, polyquaternary amines, styrene maleic anhydride (SMA) resins, and polyethylene amine. Water soluble polymers further include carbohydrates such as starch derived from different plant sources, including high amylose and high amylopectin varieties. By "starch," as referred to herein, is also meant water soluble film forming polymeric materials derived from starch including starch derivatives such as starch hydrolyzate products, modified starches, modified starch derivatives and maltodextrins.

The acid containing coating is deposited over the patterned resist in a manner that it covers or at least substantially covers the structural features of the patterned resist. For example, if the patterned resist is comprised by a plurality of lines, then the acid containing coating fills the trenches formed by the lines of the patterned resist and covers the lines of the patterned resist or just reaches the tops of the lines of the patterned resist.

The coating contains a suitable amount of cleaving compound (acid, base, organic compound) to form a thin deprotected resist layer within the developed resist. In one embodiment, the coating contains from about 0.001% to about 10% by weight of at least one cleaving compound. In another embodiment, the coating contains from about 0.01% to about 5% by weight of at least one cleaving compound. In yet another embodiment, the coating contains from about 0.05% to about 1% by weight of at least one cleaving compound. Generally, a higher cleaving compound concentration in the coating leads to a thicker resulting thin deprotected resist layer within the developed resist. The coating may optionally further contain various additives such as coating forming additives, surfactants, mobility enhances, etc.

The time which the coating containing the cleaving compound is permitted to contact the resist depends primarily upon the identity of the cleaving compound, the concentration of the cleaving compound in the coating, the identity of the resist, and the desired size of the thin deprotected resist layer. In one embodiment, the coating containing the cleaving compound is permitted to contact the resist for a time period from about 1 second to about 3 hours, although slightly shorter or longer times may be permitted. In another embodiment, the coating containing the cleaving compound is permitted to contact the resist for a time period from about 10 seconds to about 30 minutes. In yet another embodiment, the coating containing the cleaving compound is permitted to contact the resist for a time period from about 15 seconds to about 5 minutes. Generally, a longer contact time leads to a thicker resulting thin deprotected resist layer.

Optionally, heat is applied when the coating containing the cleaving compound is contacted with the resist. In some instances, heat promotes the formation of the thin deprotection layer. In one embodiment, the coating containing the cleaving compound is contacted with the resist at a temperature from about 20° C. to about 200° C. In another embodiment, the coating is contacted with the resist at a temperature from about 40° C. to about 1 50° C. In yet another embodiment, the coating is contacted with the resist at a temperature from about 50° C. to about 110° C. In some embodiments where the cleaving compound is and acid, heat particularly promotes the formation of the thin deprotection layer.

The thickness of the thin deprotected resist layer formed within the resist is from about 10 Å to about 1,000 Å. In another embodiment, the thickness of the thin deprotected resist layer formed within the resist is from about 20 Å to about 800 Å. In yet another embodiment, the thickness of the thin deprotected resist layer formed within the resist is from about 25 Å to about 600 Å. In one embodiment, the thickness of the thin deprotected resist layer is substantially uniform in the portions adjacent the coating containing the cleaving compound in that the thickness does not vary by more than about 100 Å, and preferably by not more than about 10 Å, comparing the thickest and thinnest areas.

The coating containing the cleaving compound is removed from the substrate using any suitable means, such as using a removing solution. Generally, the coating containing the cleaving compound is removed from the substrate using an aqueous, basic, acidic or organic solution. It is noted that in some embodiments, the removing solution may also remove the thin deprotected resist layer. This is permissible so long as the patterned resist is not deformed or degraded by the removing solution. The aqueous, basic, acidic or organic solution adsorbs, dissolves, and/or solubilizes the coating containing the cleaving compound. In an optional embodiment, the substrate is rinsed after the coating is removed. In some instances, rinsing with water serves to quench or inhibit further chemical change induced by the cleaving compound upon the patterned resist. Removing solutions include water, deionized water, hydroxide solutions such as sodium hydroxide solutions, potassium hydroxide solutions, quaternary ammonium hydroxide solutions, mildly acidic solutions, and organic solvents, all of which may optionally contain at least one surfactant.

The thin deprotected resist layer is then removed from the patterned resist (it is noted that the thin deprotected resist layer may be removed from the patterned resist during removal of the coating containing the cleaving compound). The thin deprotected resist layer is removed in a manner so that the remaining patterned resist is not deformed or degraded. In this connection, the patterned resist acts as an etch stop layer when removing the thin deprotected resist layer. Dry or wet etching techniques may be employed, although wet etch techniques are preferred. In a preferred embodiment, a developer, commonly used to pattern an irradiated resist, is used to remove the thin deprotected resist layer from the patterned resist. For example, hydroxide developers including sodium hydroxide solutions, potassium hydroxide solutions, quaternary (alkyl) ammonium hydroxide solutions, all of which may or may not contain at least one surfactant, may be employed.

Remaining on the substrate is one or more structures (depending upon the shape of the patterning of the resist) of a patterned resist in which the features or structures of the resist are smaller compared to immediately after development. In one embodiment, the patterned resist treated in accordance with the present invention contains sub-lithographic structures or features. Sub-lithographic structures have dimensions that are smaller than those obtainable without the methods of the present invention. For example, sub-lithographic structures, such as a line, have a dimension such as a width from about 250 Å to about 2,000 Å, and in other instances from about 500 Å to about 1,500 Å. In another embodiment, the patterned resist treated in accordance with the present invention contains structures or features that have been reduced to a desired extent, but are not necessarily sub-lithographic.

The dimensions of the resulting features or structures depend primarily upon the specific identity and amount of the cleaving compound, the length of time the coating containing the cleaving compound is in contact with the patterned resist, and the identity of the resist material. The dimensions of the resulting features or structures are decreased corresponding to the size of the thin deprotected resist layer.

The resulting resist pattern made in accordance with the present invention may be useful for subsequent processing of the substrate on which it is positioned. For example, the resist pattern made in accordance with the present invention may be used for forming narrow features using one of photolithography techniques (pattern transfer to underlying layer), etching techniques, or deposition techniques. In particular, the resist pattern made in accordance with the present invention may be used as a mask during photolithography techniques, etching techniques, or deposition techniques. In one embodiment, the resist pattern made in accordance with the present invention consists of a plurality of lines that are narrower than the originally patterned resist, the resist pattern is used as a mask during etching thereby forming lines under the patterned resist. In this embodiment, the lines formed under the patterned resist made in accordance with the present invention are narrower than lines that could have been formed under the originally patterned resist. In another embodiment, the resist pattern made in accordance with the present invention contains a plurality of openings for forming contact holes that are larger than the originally patterned resist, and the resist pattern is used as a mask during etching thereby forming contact holes adjacent the patterned resist. In this embodiment, the contact holes formed adjacent the patterned resist made in accordance with the present invention are larger than contact holes that could have been formed under the originally patterned resist.

One specific embodiment of the methods of the present invention is now described in connection with Figures. Referring to FIG. 1, a substrate 10 is provided with a patterned acid catalyzed resist 12A over a portion of the substrate 10. Although not shown, substrate 10 may include any suitable semiconductor material (one or more layers of semiconductor materials), for example, a monocrystalline silicon substrate. Also, although not shown, substrate 10 may include of one or more layers including substrate layers, diffusion regions, dielectric layers such as oxides, devices, polysilicon layers, and the like. An acid containing coating 14 is deposited over the substrate 10 covering the patterned resist 12A. The patterned resist 12A has a width of about 3,000 Å.

Figure 2:
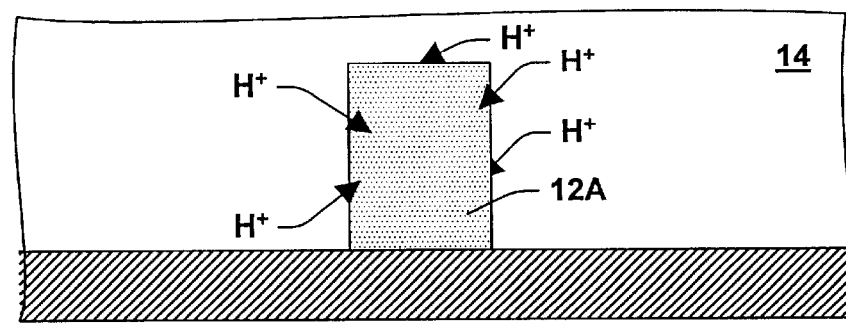
FIG. 2 illustrates a cross-sectional view of one aspect of a method according to the present invention.

Referring to FIG. 2, mobile hydronium ions in the acid containing coating 14 near the patterned resist 12A diffuse into the patterned resist 12A and begin to form a thin deprotected resist layer (not shown yet). Although not wishing to be bound by any theory, it is believed that hydronium ions effect chemical change by cleaving acid labile moieties of the resist polymer material.

Figure 3:
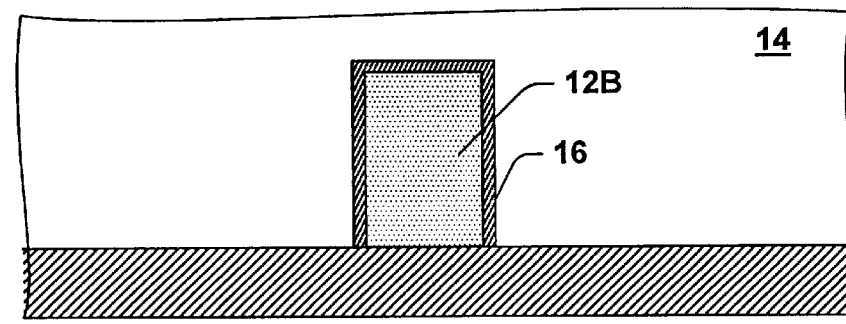
FIG. 3 illustrates a cross-sectional view of one aspect of a method according to the present invention.

Referring to FIG. 3, after a suitable period of time, a thin deprotected resist layer 16 forms within the original patterned resist 12A. A portion of patterned resist 12A is not chemically influenced by the acid containing coating 14 and remains as patterned resist 12B. In this embodiment, the thickness of the thin deprotected resist layer 16 is about 300 Å. The thickness of the thin deprotected resist layer 16 is substantially uniform around the patterned resist 12B.

Figure 4:
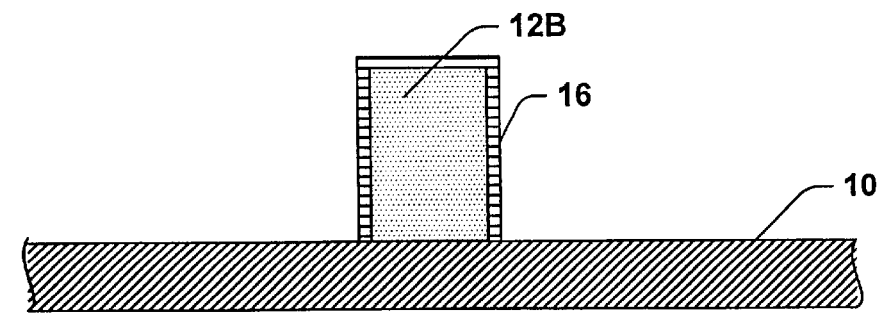
FIG. 4 illustrates a cross-sectional view of one aspect of a method according to the present invention.

Referring to FIG. 4, the acid containing coating 14 is removed by suitable means. For example, a water rinse is used to remove the acid containing coating 14 from substrate 10 leaving the thin deprotected resist layer 16 around patterned resist 12B.

Figure 5:
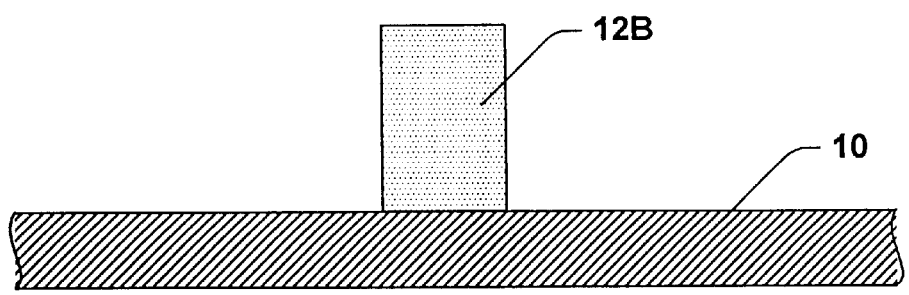
FIG. 5 illustrates a cross-sectional view of the results of one aspect of a method according to the present invention.
Figure 6:
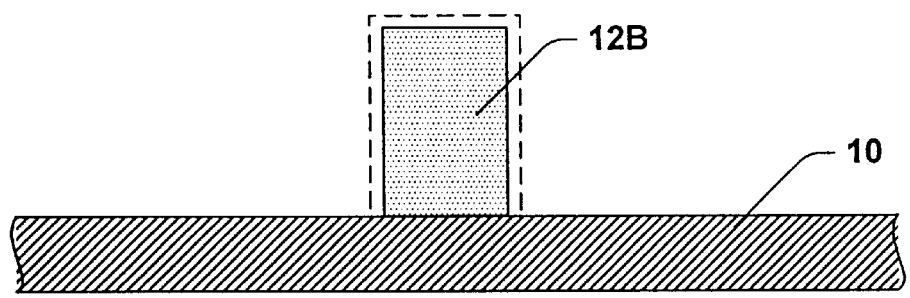
FIG. 6 illustrates a cross-sectional view of the results of one aspect of a method according to the present invention.

Referring to FIG. 5, the thin deprotected resist layer 16 is removed by suitable means. For example, the structure is contacted with a suitable developer to remove the thin deprotected resist layer 16 from substrate 10 leaving the patterned resist 12B. The patterned resist 12B is not degraded or damaged by the removal.

Referring to FIG. 5, the patterned resist 12B is shown again over substrate 10, except that dashed lines are added to indicate the space assumed by original patterned resist 12A. In this embodiment, the width of patterned resist 12B is about 2,400 Å. Improved critical dimension control is thus achieved by the methods of the present invention. The patterned resist 12B may be used in further semiconductor processing, such as for transferring a pattern to an underlying layer in substrate 10 (acting as etch mask pattern). The patterned resist 12B is particularly useful for forming narrow features using one of photolithography techniques, etching techniques, or deposition techniques.

One advantageous aspect of the chemical trim process of the present invention is the ability to decrease the size of structural resist features made using lithographic techniques. This size reduction technique can be employed to trim patterned resist features and/or reduce the size of patterned resist features below the limits of lithography. Moreover, anther advantageous aspect of the chemical trim process of the present invention is the ability to controllably decrease the size of structural resist features primarily by varying the amount of cleaving compound in the coating containing the cleaving compound, varying the identity of the cleaving compound in the coating containing the cleaving compound, and varying the time in which the coating is in contact with the patterned resist.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of treating a patterned resist comprising:
   providing the patterned resist having structural features of a first size, the patterned resist comprising a polymer having a labile group;
   contacting a coating containing at least one cleaving compound with the patterned resist to form a thin deprotected resist layer at an interface between the patterned resist and the coating; and
   removing the coating and the thin deprotected resist layer leaving the patterned resist having structural features of a second size, wherein the second size is smaller than the first size.

2. The method of claim 1, wherein the polymer having the labile group is a chemically amplified photoresist.

3. The method of claim 1, wherein the labile group is one of an acid labile group, a base labile group, and an organic labile group.

4. The method of claim 1, wherein the coating comprises at least one of an acid, a base, and an organic compound.

5. The method of claim 1, wherein the coating comprises at least one of a water soluble polymer and a base soluble polymer.

6. The method of claim 1, wherein the thickness of the thin deprotected resist layer is from about 10 Å to about 1,000 Å.

7. The method of claim 1, wherein the coating comprises from about 0.001% to about 10% by weight of at least one cleaving compound.

8. A chemical trim process comprising:
   forming a patterned resist, the patterned resist comprising a polymer having an acid labile pendent group;
   depositing an acid containing coating over the patterned resist, the acid containing coating comprising at least one acid and a coating material, thereby forming a thin deprotected resist layer at an interface between the patterned resist and the acid containing coating; and
   removing the acid containing coating and the thin deprotected resist layer thereby providing a trimmed patterned resist.

9. The method of claim 8, wherein the patterned resist comprises a mid ultraviolet photoresist, deep ultraviolet photoresist, or an extreme ultraviolet photoresist.

10. The method of claim 8, wherein the acid containing coating contains from about 0.001% to about 10% by weight of at least one acid.

11. The method of claim 9, wherein the at least one acid comprises at least one of nitric acid, hydrofluoric acid, hydrochloric acid, hydrobromic acid, hydriotic acid, sulfuric acid, sulfurous acid, perchloric acid, boric acid, phosphorus acid, phosphoric acid, formic acid, acetic acid, propionic acid, butyric acid, dichloroacetic acid, trichloroacetic acid, perfluoroacetic acid, perfluorooctanoic acid, oxalic acid, malonic acid, succinic acid, citric acid, dimethylphosphoric acid, dimethylphosphinic acid, methanesulfonic acid, ethanesulfonic acid, 1-pentanesulfonic acid, 1-hexanesulfonic acid, 1-heptanesulfonic acid, benzenesulfonic acid, benzenedisulfonic acid, tolulenesulfonic acid, and naphthalenesulfonic acid.

12. The method of claim 8, wherein the acid containing coating comprises at least one of poly(acrylic acid), poly (methacrylic acid), poly(vinyl alcohol), cellulose derivatives, natural polysaccharide gums and their derivatives, polyethylene glycol, water soluble polyesters, polyvinyl pyrrolidone, polycarboxylic acid derivatives, vinyl methyl ether homopolymers and copolymers, casein, gelatin, solubilized proteins, polyacrylamide, polyamines, polyquaternary amines, styrene maleic anhydride resins, polyethylene amine, novolac polymers, and poly(p-hydroxystyrene).

13. The method of claim 8, wherein the acid labile pendant group comprises at least one of a t-butoxycarbonyl group, an ether group, an acetal group, and a ketal group.

14. The method of claim 8, wherein the acid containing coating covered patterned resist is heated to a temperature from about 40° C. to about 200° C. for a time period from about 10 seconds to about 30 minutes prior to removing the acid containing coating and the thin deprotected resist layer.

15. A method of making a sub-lithographic structure, comprising:
   patterning a chemically amplified resist so as to have lithographic structures;
   contacting an acid containing coating with the patterned chemically amplified resist thereby forming a thin deprotected resist layer within the patterned chemically amplified resist; and
   removing the acid containing coating and the thin deprotected resist layer leaving sub-lithographic structures of the chemically amplified resist.

16. The method of claim 15, wherein the chemically amplified resist comprises a photosensitive acid generator and a polymer having acid sensitive side chain groups which are bonded to the polymer backbone and are reactive towards a proton.

17. The method of claim 15, wherein the acid containing coating comprises at least one of poly(acrylic acid), poly (methacrylic acid), poly(vinyl alcohol), cellulose derivatives, natural polysaccharide gums and their derivatives, polyethylene glycol, water soluble polyesters, polyvinyl pyrrolidone, polycarboxylic acid derivatives, vinyl methyl ether homopolymers and copolymers, casein, gelatin, solubilized proteins, polyacrylamide, polyamines, polyquaternary amines, styrene maleic anhydride resins, polyethylene amine, novolac polymers, and poly(p-hydroxystyrene).

18. The method of claim 15, wherein the thin deprotected resist layer has a thickness from about 20 Å to about 800 Å.

19. The method of claim 15, wherein the the acid containing coating covered patterned resist is heated to a temperature from about 40° C. to about 150° C. for a time period from about 15 seconds to about 10 minutes prior to removing the acid containing coating and the thin deprotected resist layer.

20. The method of claim 15, wherein the sub-lithographic structure is a line having a width from about 250 Å to about 2,000 Å.

21. A chemical trim process comprising:
   forming a patterned resist, the patterned resist comprising a polymer having a base labile pendent group;

depositing a base containing coating over the patterned resist, the base containing coating comprising at least one base and a coating material, thereby forming a thin deprotected resist layer at an interface between the patterned resist and the acid containing coating; and removing the base containing coating and the thin deprotected resist layer thereby providing a trimmed patterned resist.

22. A chemical trim process comprising:

forming a patterned resist, the patterned resist comprising a polymer having an organic labile pendent group;

depositing an organic compound containing coating over the patterned resist, the organic compound containing coating comprising at least one organic compound and a coating material, thereby forming a thin deprotected resist layer at an interface between the patterned resist and the acid containing coating; and removing the organic compound containing coating and the thin deprotected resist layer thereby providing a trimmed patterned resist.

* * * * *